United States Patent
Song et al.

(10) Patent No.: US 9,659,637 B2
(45) Date of Patent: May 23, 2017

(54) CORRELATING PHYSICAL PAGE ADDRESSES FOR SOFT DECISION DECODING

(71) Applicant: Western Digital Technologies, Inc., Irvine, CA (US)

(72) Inventors: Seung-Hwan Song, San Jose, CA (US); Kiran K. Gunnam, Milpitas, CA (US); Zvonimir Z. Bandic, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 14/823,751

(22) Filed: Aug. 11, 2015

(65) Prior Publication Data
US 2017/0047114 A1    Feb. 16, 2017

(51) Int. Cl.
G11C 5/14 (2006.01)
G11C 11/56 (2006.01)
G11C 16/28 (2006.01)
G11C 16/34 (2006.01)
G11C 16/08 (2006.01)

(52) U.S. Cl.
CPC .......... *G11C 11/5642* (2013.01); *G11C 16/08* (2013.01); *G11C 16/28* (2013.01); *G11C 16/3436* (2013.01)

(58) Field of Classification Search
USPC ............ 365/189.15, 189.09, 230.03, 230.06
See application file for complete search history.

(56) References Cited

U.S. PATENT DOCUMENTS

| | | | |
|---|---|---|---|
| 8,856,611 B2 | 10/2014 | Wu et al. | |
| 8,924,824 B1 | 12/2014 | Lu | |
| 8,943,384 B2 | 1/2015 | Sridhara et al. | |
| 9,007,854 B1 * | 4/2015 | Nemati Anaraki | G06F 11/10 365/189.09 |
| 2012/0134207 A1 | 5/2012 | Yoon et al. | |
| 2014/0040531 A1 | 2/2014 | Wu et al. | |

(Continued)

OTHER PUBLICATIONS

Wang, et al., "Soft Information for LDPC Decoding in Flash: Mutal-Information Opitimized Quantization", IEEE Global Telecomm. Conference, Dec. 2011, 6 pp.

(Continued)

*Primary Examiner* — Vu Le
(74) *Attorney, Agent, or Firm* — Patterson & Sheridan, LLP (57) ABSTRACT

A storage device may include a processor and a memory device including a multilevel memory cell. The processor may correlate a first physical page address and a second physical page address, each address being associated with the multilevel memory cell. The processor also may apply a first read operation to the memory cell to determine a value of a first bit associated with the first physical page address. The processor additionally may apply at least a second read operation to the multilevel memory cell to determine a value of a second bit associated with the second physical page address. The processor may determine, based at least in part on the value of the first bit and the value of the second bit, a soft decision value associated with the second bit. The processor may verify the value of the second bit based at least in part on the soft decision value.

14 Claims, 6 Drawing Sheets

(56) References Cited

U.S. PATENT DOCUMENTS

| | | |
|---|---|---|
| 2014/0104943 A1 | 4/2014 | Chen et al. |
| 2014/0153330 A1* | 6/2014 | Yoon .................. G11C 11/5642 365/185.03 |
| 2014/0164868 A1 | 6/2014 | Haratsch et al. |
| 2014/0169102 A1 | 6/2014 | Sun et al. |
| 2014/0181617 A1 | 6/2014 | Wu et al. |
| 2014/0281822 A1 | 9/2014 | Wu et al. |

OTHER PUBLICATIONS

Search and Examination Report from counterpart British Application No. GB1613646.7, dated Sep. 28, 2016, 3 pp.

* cited by examiner

CORRELATING PHYSICAL PAGE ADDRESSES FOR SOFT DECISION DECODING

TECHNICAL FIELD

This disclosure relates to reading data from memory devices that store multiple bits per cell.

BACKGROUND

Storage devices used in computers or other electronics devices may be non-volatile memory or volatile memory. The main difference between non-volatile memory and volatile memory is that non-volatile memory may continue to store data without requiring a persistent power supply. As a result, non-volatile memory devices have developed into a popular type of memory for a wide range of electronic applications. For instance, non-volatile memory devices, including flash memory devices, are commonly incorporated into solid-state storage devices, such as solid-state drives (SSDs). To increase storage density, some SSDs and other memory devices store multiple bits of data per physical cell. Although this increases storage density, reading data from physical cells that store multiple bits of information may be more difficult, and may utilize multiple re-read operations to obtain soft decision information of the cells, incurring long read latency and read disturbance issues.

SUMMARY

In some examples, the disclosure describes a method including correlating, by at least one processor, a first physical page address associated with a multilevel memory cell and a second physical page address associated with the multilevel memory cell. The method also may include causing, by the at least one processor, at least a first read operation to be applied to the multilevel memory cell to determine a value of a first bit associated with the first physical page address. In some examples, the method additionally may include causing, by the at least one processor, at least a second read operation to be applied to the multilevel memory cell to determine a value of a second bit associated with the second physical page address. The method further may include determining, by the at least one processor, a soft decision value associated with the second bit based on the value of the first bit and the value of the second bit. Further, the method may include verifying, by the at least one processor, based at least in part on the soft decision value, the value of the second bit.

In some examples, the disclosure describes a storage device that includes at least one processor and at least one memory device comprising at least one multilevel memory cell. The processor may be configured to correlate a first physical page address associated with the multilevel memory cell and a second physical page address associated with the multilevel memory cell. The processor also may be configured to cause at least a first read operation to be applied to the multilevel memory cell to determine a value of a first bit associated with the first physical page address. In some examples, the processor further may be configured to cause at least a second read operation to be applied to the multilevel memory cell to determine a value of a second bit associated with the second physical page address. The processor also may be configured to determine a soft decision value associated with the second bit based at least in part on the value of the first bit and the value of the second bit. The processor additionally may be configured to verify, based at least in part on the soft decision value, the value of the second bit.

In some examples, the disclosure describes a computer-readable storage medium that stores instructions that, when executed, cause at least one processor to correlate a first physical page address associated with a multilevel memory cell and a second physical page address associated with the multilevel memory cell. The instructions, when executed, also may cause the at least one processor to cause at least a first read operation to be applied the multilevel memory cell to determine a value of a first bit associated with the first physical page address. In some examples, the instructions, when executed, may cause the at least one processor to cause at least a second read operation to be applied to the multilevel memory cell to determine a value of a second bit associated with the second physical page address. Additionally, the instructions, when executed, may cause the at least one processor to determine a soft decision value associated with the second bit based at least in part on the value of the first bit and the value of the second bit. Further, the instructions, when executed may cause the at least one processor to verify, based at least in part on the soft decision value, the value of the second bit.

In some examples, the disclosure describes a storage device that includes at least one memory device comprising at least one multilevel memory cell. The storage device also may include means for correlating a first physical page address associated with the multilevel memory cell and a second physical page address associated with the multilevel memory cell. In some examples, the storage device further may include means for applying at least a first read operation to the multilevel memory cell to determine a value of a first bit associated with the first physical page address. Additionally, the storage device may include means for applying at least a second read operation to the multilevel memory cell to determine a value of a second bit associated with the second physical page address. Further, the storage device may include means for determining a soft decision value based at least in part on the value of the first bit and the value of the second bit. In some examples, the storage device also may include means for verifying, based at least in part on the soft decision value, the value of the second bit.

The details of one or more examples are set forth in the accompanying drawings and the description below. Other features, objects, and advantages will be apparent from the description and drawings, and from the claims.

DETAILED DESCRIPTION

The disclosure describes techniques for reading data from memory cells storing multiple bits of data. In memory cells storing multiple bits of data, such as multi-level cell (MLC) flash memory cells or triple-level cell (TLC) flash memory cells, a memory cell may be associated with a multiple physical page addresses. For example, a MLC flash memory cell may be associated with a first physical page address (for a first bit stored by the MLC flash memory cell) and second physical page address (for a second bit stored by the MLC flash memory cell). At least one processor, which may include a controller, a read channel, or both, may correlate the first physical page address and the second physical page address. By correlating the first physical page address and the second physical page address, the at least one processor may utilize information associated with a value of a first bit associated with the first physical page address when determining a value of a second bit associated with the second physical page address. In some examples, this may reduce a number of reads utilized by the at least one processor to read the bit associated with the second physical page address, increase an accuracy with which the at least one processor determines the value of the bit associated with the second physical page address, or both. In some examples, reducing a number of reads utilized by the at least one processor to read the bit associated with the second physical page address may reduce a read overhead associated with reading data associated with the second physical page address, which may improve a read throughput, decrease wear on the memory cell, or both.

In some examples, the at least one processor may utilize soft decision decoding to verify the value of the second bit. For example, the at least one processor may utilize the value of the first bit and the value of the second bit to calculate a log-likelihood ratio (LLR) value that the at least one processor then utilizes to verify the value of the second bit. In some examples, the at least one processor may use the LLR value in a low-density parity check (LDPC) to validate the value of the second bit. As described above, because the first and second physical page addresses are correlated, if the at least one processor has previously caused the first physical page address to be read, the at least one processor may utilize the previously read bit value associated with the first physical page address to calculate the LLR.

In a MLC flash memory cell or a TLC flash memory cell, the various bit values as stored as voltage levels within the memory cell. In some examples, because the at least one processor may utilize the value of the first bit in determining the value of the second bit, voltage levels on either side of a bit transition (e.g., from a 0 to a 1 or from a 1 to a 0) for the second bit may be more closely spaced than voltage levels on either side of a bit transition for the first bit. The greater spacing between the voltage levels for the bit transitions for the first bit may provide greater discrimination between 0 bit values and 1 bit values for the first bit, and the soft decision decoding value determined using the first bit value and the second bit value may be utilized to verify the value of the second bit, allowing closer spacing of the voltage states for the second bit.

Figure 1:
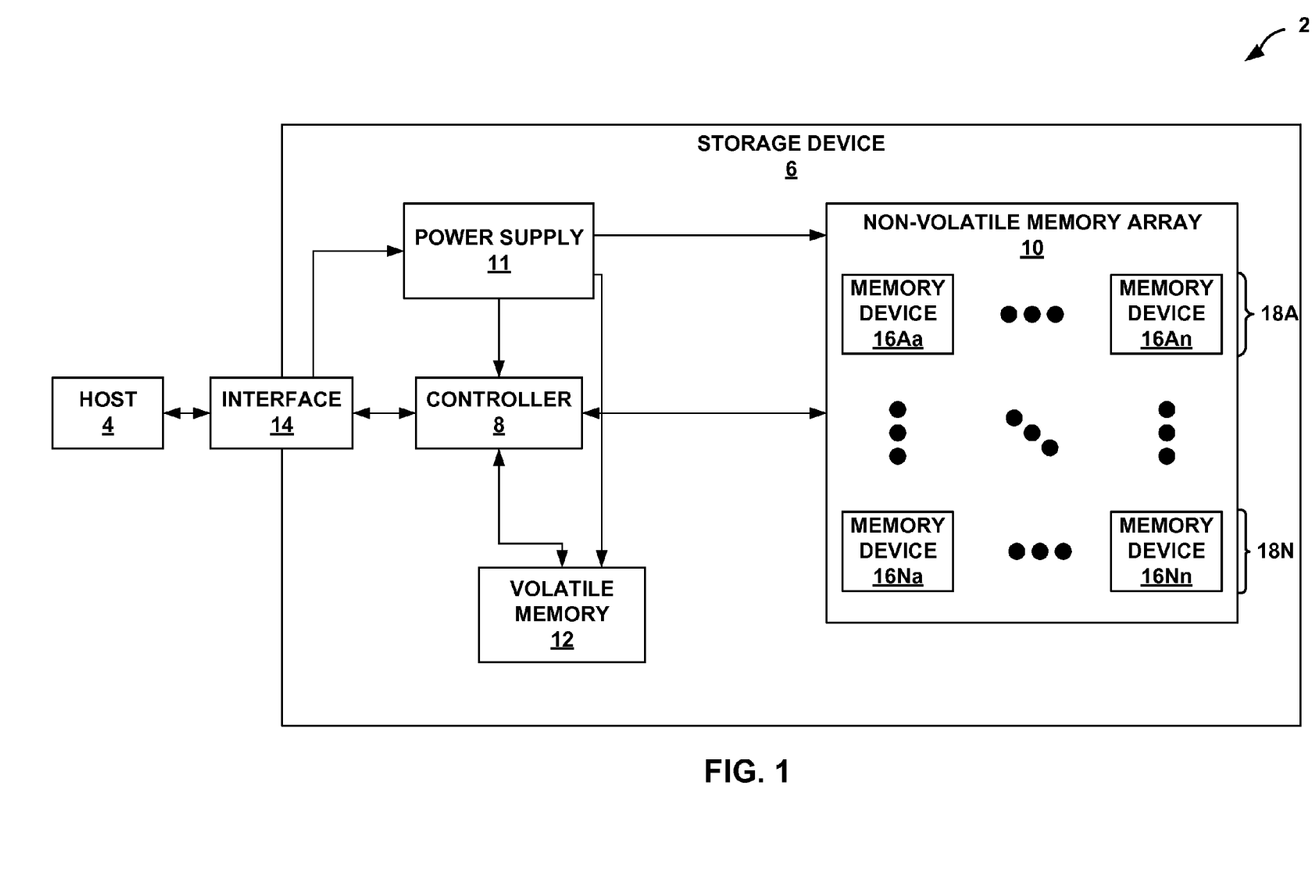
FIG. 1 is a conceptual and schematic block diagram illustrating an example storage environment in which a storage device may function as a storage device for a host device, in accordance with one or more techniques of this disclosure.

FIG. 1 is a conceptual and schematic block diagram illustrating an example storage environment 2 in which storage device 6 may function as a storage device for host device 4, in accordance with one or more techniques of this disclosure. For instance, host device 4 may utilize non-volatile memory devices included in storage device 6 to store and retrieve data. In some examples, storage environment 2 may include a plurality of storage devices, such as storage device 6, that may operate as a storage array. For instance, storage environment 2 may include a plurality of storages devices 6 configured as a redundant array of inexpensive/independent disks (RAID) that collectively function as a mass storage device for host device 4.

Storage environment 2 may include host device 4 which may store and/or retrieve data to and/or from one or more storage devices, such as storage device 6. As illustrated in FIG. 1, host device 4 may communicate with storage device 6 via interface 14. Host device 4 may comprise any of a wide range of devices, including computer servers, network attached storage (NAS) units, desktop computers, notebook (i.e., laptop) computers, tablet computers, set-top boxes, telephone handsets such as so-called "smart" phones, so-called "smart" pads, televisions, cameras, display devices, digital media players, video gaming consoles, video streaming device, and the like. Host device 4 may identify data stored in storage environment 2 using logical or virtual addresses.

As illustrated in FIG. 1 storage device 6 may include controller 8, non-volatile memory array 10 (NVMA 10), power supply 11, volatile memory 12, and interface 14. In some examples, storage device 6 may include additional components not shown in FIG. 1 for sake of clarity. For example, storage device 6 may include a printed board (PB) to which components of storage device 6 are mechanically attached and which includes electrically conductive traces that electrically interconnect components of storage device 6; and the like. In some examples, the physical dimensions and connector configurations of storage device 6 may conform to one or more standard form factors. Some example standard form factors include, but are not limited to, 3.5" hard disk drive (HDD), 2.5" HDD, 1.8" HDD, peripheral component interconnect (PCI), PCI-extended (PCI-X), PCI Express (PCIe) (e.g., PCIe x1, x4, x8, x16, PCIe Mini Card, MiniPCI, etc.). In some examples, storage device 6 may be directly coupled (e.g., directly soldered) to a motherboard of host device 4.

Storage device 6 may include interface 14 for interfacing with host device 4. Interface 14 may include one or both of a data bus for exchanging data with host device 4 and a control bus for exchanging commands with host device 4. Interface 14 may operate in accordance with any suitable protocol. For example, interface 14 may operate in accordance with one or more of the following protocols: advanced technology attachment (ATA) (e.g., serial-ATA (SATA) and parallel-ATA (PATA)), Fibre Channel, small computer system interface (SCSI), serially attached SCSI (SAS), peripheral component interconnect (PCI), PCI-express, or Non-Volatile Memory Express (NVMe). The electrical connection of interface 14 (e.g., the data bus, the control bus, or both) is electrically connected to controller 8, providing electrical connection between host device 4 and controller 8, allowing data to be exchanged between host device 4 and controller 8. In some examples, the electrical connection of interface 14 may also permit storage device 6 to receive power from host device 4. For example, as illustrated in FIG. 1, power supply 11 may receive power from host device 4 via interface 14.

Storage device 6 includes controller 8, which may manage one or more operations of storage device 6. For instance, controller 8 may manage the reading of data from and/or the writing of data to memory devices 16Aa-16Nn (collectively, "memory devices 16"). In some examples, although not illustrates in FIG. 1, storage device 6 also may include a read channel, a write channel, or both, which may further manage one or more operations of storage device 6. For example, the read channel may, as one example, manage reads from memory devices 16, and the write channel may, as one example, manage writes to memory devices 16. In some examples, read channel may perform techniques of this disclosure, such as determining a values of respective bits stored by memory cells of memory devices 16.

Storage device 6 may include NVMA 10, which may include a plurality of memory devices 16. Each of memory devices 16 may be configured to store and/or retrieve data. For instance, a memory device of memory devices 16 may receive data and a message from controller 8 that instructs the memory device to store the data. Similarly, the memory device of memory devices 16 may receive a message from controller 8 that instructs the memory device to retrieve data. In some examples, each of memory devices 16 may be referred to as a die. In some examples, a single physical chip may include a plurality of dies (i.e., a plurality of memory devices 16). In some examples, each of memory devices 16 may be configured to store relatively large amounts of data (e.g., 128 MB, 256 MB, 512 MB, 1 GB, 2 GB, 4 GB, 8 GB, 16 GB, 32 GB, 64 GB, 128 GB, 256 GB, 512 GB, 1 TB, etc.).

In some examples, memory devices 16 may include any type of non-volatile memory devices. Some examples, of memory devices 16 include, but are not limited to flash memory devices, phase-change memory (PCM) devices, resistive random-access memory (ReRAM) devices, magnetoresistive random-access memory (MRAM) devices, ferroelectric random-access memory (F-RAM), holographic memory devices, and any other type of non-volatile memory devices.

Figure 2:
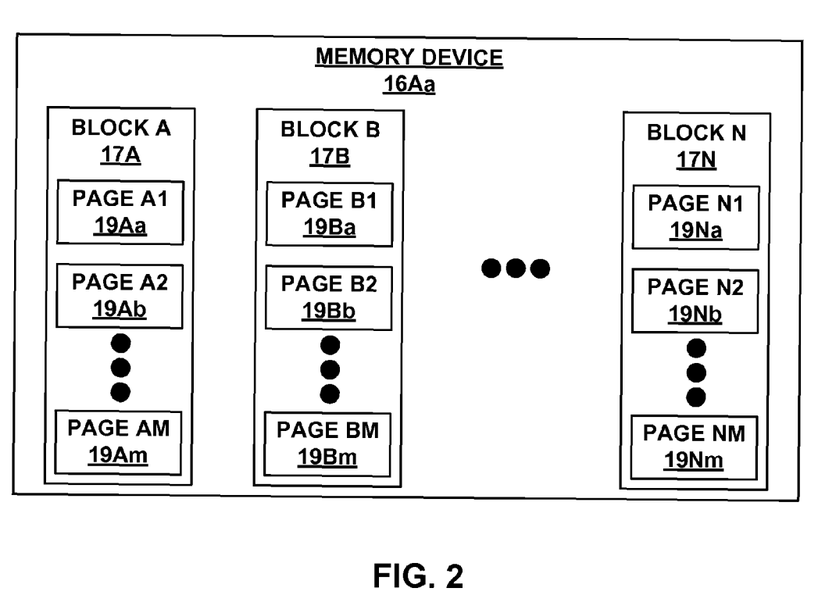
FIG. 2 is a conceptual diagram illustrating an example memory device, in accordance with one or more techniques of this disclosure.

Flash memory devices may include NAND or NOR based flash memory devices, and may store data based on a charge contained in a floating gate of a transistor for each flash memory cell. In NAND flash memory devices, the flash memory device may be divided into a plurality of blocks, each of which may be divided into a plurality of pages. FIG. 2 is a conceptual block diagram illustrating an example memory device 16Aa, which includes a plurality of blocks 17A-17N (collectively, "blocks 17"), each of which is divided into a plurality of pages 19Aa-19Nm (collectively, "pages 19"). Each page of the pages 19 within a particular memory device (e.g., memory device 16Aa) may include a plurality of flash memory cells. In NAND flash memory devices, rows of flash memory cells may be electrically connected using a word line to define a page of the plurality of pages 19. Respective cells in each of the pages 19 may be electrically connected to respective bit lines. Controller 8 may write data to and read data from NAND flash memory devices at the page level and erase data from NAND flash memory devices at the block level.

In some examples, rather than each flash memory cell storing a single bit of data, each flash memory cell may include multiple bits of data. For example, flash memory cells of memory devices 16 may include MLC flash memory cells, TLC flash memory cells, or the like. In some examples, each bit in a MLC flash memory cell or a TLC flash memory cell is associated with a respective page of pages 19. For example, a first bit stored by a MLC flash memory cell may be associated with an upper page and a second bit stored by a MLC flash memory cell may be associated with a lower page. Similarly, a first bit stored by a TLC flash memory cell may be associated with an upper page, a second bit stored by a TLC flash memory cell may be associated with a middle page, and a third bit stored by a TLC flash memory cell may be associated with a lower page. Similarly, respective bits of MLC and TLC flash memory cells may be associated with respective physical page addresses, as described in more detail below.

In some examples, it may not be practical for controller 8 to be separately connected to each memory device of memory devices 16. As such, the connections between memory devices 16 and controller 8 may be multiplexed. As an example, memory devices 16 may be grouped into channels 18A-18N (collectively, "channels 18"). For instance, as illustrated in FIG. 1, memory devices 16Aa-16An may be grouped into first channel 18A, and memory devices 16Na-16Nn may be grouped into $N^{th}$ channel 18N. The memory devices 16 grouped into each of channels 18 may share one or more connections to controller 8. For instance, the memory devices 16 grouped into first channel 18A may be attached to a common I/O bus and a common control bus. Storage device 6 may include a common I/O bus and a common control bus for each respective channel of channels 18. In some examples, each channel of channels 18 may include a set of chip enable (CE) lines which may be used to multiplex memory devices on each channel. For example, each CE line may be connected to a respective memory device of memory devices 16. In this way, the number of separate connections between controller 8 and memory devices 16 may be reduced. Additionally, as each channel has an independent set of connections to controller 8, the reduction in connections may not significantly affect the data throughput rate as controller 8 may simultaneously issue different commands to each channel.

Storage device 6 may include power supply 11, which may provide power to one or more components of storage device 6. When operating in a standard mode, power supply 11 may provide power to the one or more components using power provided by an external device, such as host device 4. For instance, power supply 11 may provide power to the one or more components using power received from host device 4 via interface 14. In some examples, power supply 11 may include one or more power storage components configured to provide power to the one or more components when operating in a shutdown mode, such as where power ceases to be received from the external device. In this way, power supply 11 may function as an onboard backup power source. Some examples of the one or more power storage components include, but are not limited to, capacitors, super capacitors, batteries, and the like. In some examples, the amount of power that may be stored by the one or more power storage components may be a function of the cost and/or the size (e.g., area/volume) of the one or more power storage components. In other words, as the amount of power stored by the one or more power storage components increases, the cost and/or the size of the one or more power storage components also increases.

Storage device 6 may include volatile memory 12, which may be used by controller 8 to store information. In some examples, controller 8 may use volatile memory 12 as a cache. For instance, controller 8 may store cached information 13 in volatile memory 12 until cached information 13 is written to memory devices 16. As illustrated in FIG. 1, volatile memory 12 may consume power received from power supply 11. Examples of volatile memory 12 include, but are not limited to, random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, and the like).

In some examples, controller 8 may use volatile memory 12 to store a logical to physical (or virtual to physical) data address translation table. Host device 4 may refer to a unit of data using the logical data address, and controller 8 may utilize physical data addresses to direct writing of data to and reading of data from memory devices 16. In some examples, the logical to physical data address translation table may include entries that include a logical data address and a corresponding physical data address. In some examples, rather than each entry in the logical to physical data address translation table including a logical data address, the logical to physical data address translation table may include an index that encodes the respective logical data address of each entry in the logical to physical data address translation table. In some of these examples, the logical to physical data address translation table may not store the index value (or logical data address) with the respective entries in the logical to physical data address translation table.

In accordance with one or more techniques of this disclosure, controller 8 may correlate physical page addresses associated with the same memory cells. For example, the memory cells may each store two bits and be referred to as MLC flash memory cells. A set of MLC flash memory cells may be associated with a first physical page address for the respective first bits of the respective MLC flash memory cells of the set of MLC flash memory cells. The first set of MLC flash memory cells may be associated with a second physical page address for the respective second bits of the respective MLC flash memory cells. Controller 8 may correlate the first physical page address with the second physical page address. In some examples, the first physical page address is associated with an upper page and the second physical page address is associated with a lower page.

Controller 8 may read data from the upper page associated with the first physical page address. For example, for a MLC flash memory cell, controller 8 may cause two read reference voltages to be applied the multilevel memory cell to determine a value of a first bit associated with the first physical page address. In this way, controller 8 may determine whether the first bit stored by the MLC flash memory cell and associated with the upper page is a 0 or a 1. In some examples, controller 8 may cause the value of the first bit stored by the MLC flash memory cell and associated with the upper page to be stored by volatile memory 12.

Controller 8 later may receive a request from host 4 to read data that controller 8 determines is associated with the second, lower page of the MLC flash memory cell. Controller may cause a third read reference voltage (different than the first two read reference voltages) to be applied to the MLC flash memory cell. This third read reference voltage may be selected to be between a first memory cell voltage state associated with a 0 value for the second bit and a second memory cell voltage state associated with a 1 value for the second bit. This may provide information regarding a value of the second bit associated with the lower page (and the second physical page address).

Controller 8 may also determine a soft decision value associated with the second bit (the lower page bit) based on the value of the first bit (the upper page bit) and the second bit from the MLC flash memory cell. In some examples, the soft decision value may include a log-likelihood-ratio (LLR). A LLR for a certain bit ($b_i$) can be calculated with a scaling factor (S), a probability that the certain bit has a value 0 ($P(b_i=0)$) and a probability that the certain bit has a value 1 ($P(b_i=1)$) as follows:

$$LLR(b_i)=S*\log(P(b_i=0)/P(b_i=1))$$

For example, a relatively high absolute value of LLR may indicate a relatively higher likelihood that the value of the certain bit is the value of 0 (for positive value of LLR) or 1 (for negative value of LLR). Conversely, a relatively low absolute value of LLR may indicate a relatively lower likelihood that the value of the certain bit is the value of 0 (for positive value of LLR) or 1 (for negative value of LLR).

In accordance with one or more techniques of this disclosure, controller 8 may assign values to the soft decision value based on the values of the first and second bits. For example, controller 8 may assign a relatively large positive value (e.g., 100) to the soft decision value associated with the second bit in instances in which controller 8 determines that the first bit has a value of 1 and the second bit has a value of 0 (which indicates a high probability of that the second bit has a value of 0). As another example, controller 8 may assign a relatively small positive value (e.g., 10) to the soft decision value associated with the second bit in instances in which controller determines that the first bit has a value of 0 and second bit has a value of 0 (which indicates a low probability that the second bit has a value of 0). As an additional example, controller 8 may assign a relatively large negative value (e.g., −100) to the soft decision value of the second bit (e.g., LLR) in instances in which controller 8 determines that the first bit has a value of 1 and second bit has a value of 1 (which indicates a high probability that the second bit has a value of 1). As a further example, controller 8 may assign a relatively small negative value (e.g., −10) to the soft decision value of the second bit in instances in which controller 8 determines that the first bit has a value of 0 and second bit has a value of 1 (which indicates low probability that the second bit has a value of 1). In some examples, controller 8 may not determine the soft decision value at the time of reading the value of the first bit, and may determine the soft decision value associated with the second bit after reading both the first bit and the second bit.

Because the first and second physical page addresses are correlated and the value of the first bit may be stored in volatile memory 12 in instances in which controller 8 has read data from the upper page before reading data from the lower page, controller 8 may not cause the upper page to be read again to determine the soft decision value associated with the second bit. Instead, controller 8 may retrieve the value of the first bit from volatile memory 12 and utilize the value to determine the soft decision value associated with the second bit. This may reduce a number of read operations used to determine the value of the second bit, which may increase read throughput, reduce wear to memory devices 16, or both.

Figure 3:
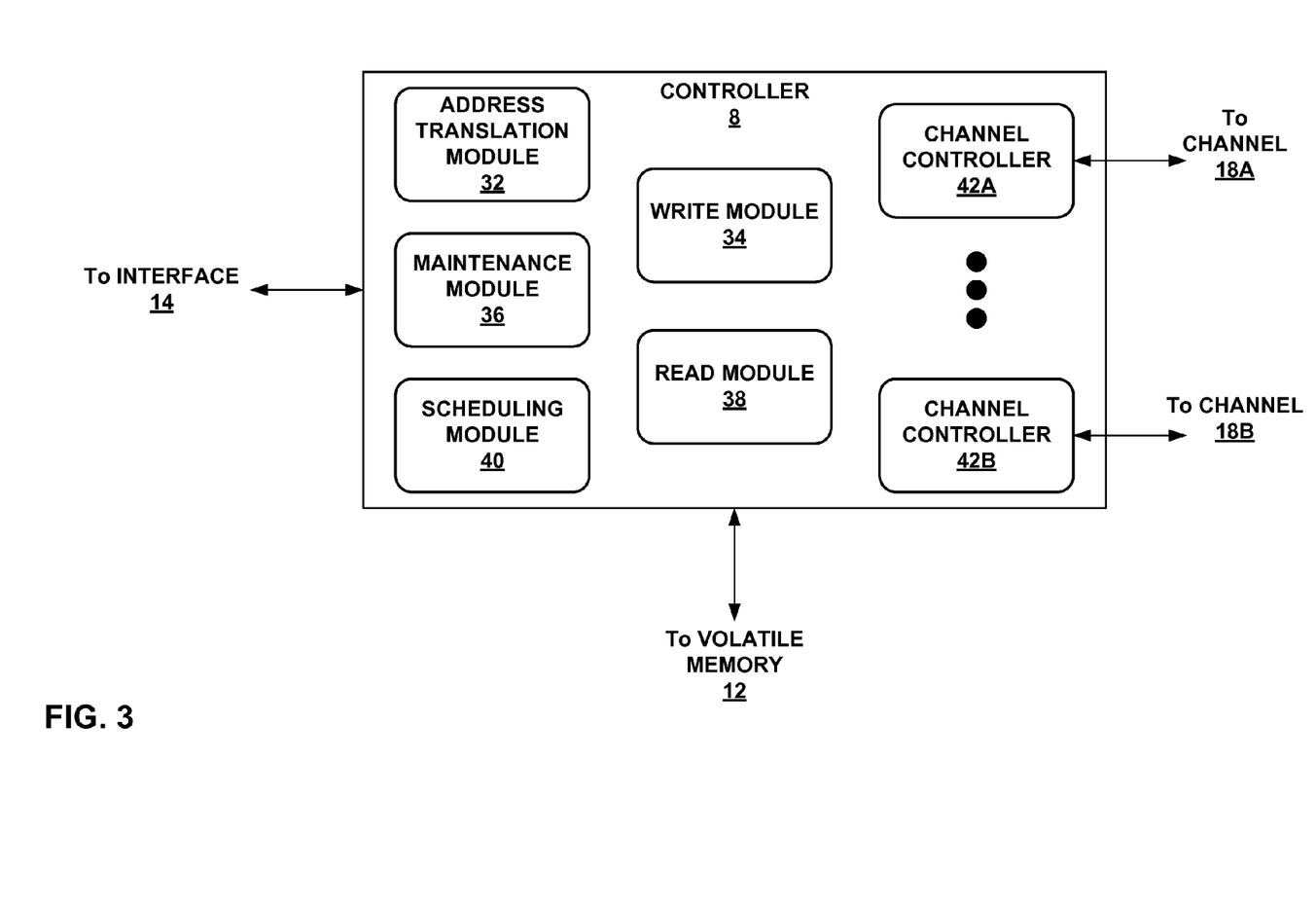
FIG. 3 is a conceptual and schematic block diagram illustrating an example controller, in accordance with one or more techniques of this disclosure.

FIG. 3 is a conceptual and schematic block diagram illustrating example details of controller 8. In some examples, controller 8 may include an address translation module 32, a write module 34, a maintenance module 36, a read module 38, a scheduling module 40, and a plurality of channel controllers 42A-42N (collectively, "channel controllers 53"). In other examples, controller 8 may include additional modules or hardware units, or may include fewer modules or hardware units. Controller 8 may include a microprocessor, digital signal processor (DSP), application specific integrated circuit (ASIC), field programmable gate array (FPGA), or other digital logic circuitry. In some examples, controller 8 may be a system on a chip (SoC).

Controller 8 may interface with the host device 4 via interface 14 and manage the storage of data to and the retrieval of data from memory devices 16. For example, write module 34 of controller 8 may manage writes to memory devices 16. For example, write module 34 may receive a message from host device 4 via interface 14 instructing storage device 6 to store data associated with a logical data address and the data. Write module 34 may manage writing of the data to memory devices 16.

For example, write module 34 may communicate with address translation module 32, which manages translation between logical data addresses used by host device 4 to manage storage locations of data and physical data addresses used by write module 34 to direct writing of data to memory devices 16. Address translation module 32 of controller 8 may utilize a logical to physical data address translation table that associates logical data addresses (or logical block addresses) of data stored by memory devices 16 to physical data addresses (or physical block addresses) of data stored by memory devices 16. For example, host device 4 may utilize the logical data addresses of the data stored by memory devices 16 in instructions or messages to storage device 6, while write module 34 utilizes physical data addresses of the data to control writing of data to memory devices 16. (Similarly, read module 38 may utilize physical data addresses to control reading of data from memory devices 16.) The physical data addresses correspond to actual, physical locations of memory devices 16.

As described above, in some examples, memory cells of memory devices 16 may be multiple-bit-per-cell memory cells, such as MLC flash memory cells, TLC flash memory cells, or the like. In some examples in which memory cells of memory devices 16 are multiple-bit-per-cell memory cells, multiple physical page addresses and multiple pages may be associated with a memory cell. For example, a first physical page address associated with an upper page and a second physical page address associated with a lower page may both be associated with a memory cell. The first physical page address and the second physical page address may be correlated in the logical to physical data address translation table. In some examples, address translation module 32 may store the logical to physical data address translation table in volatile memory 12.

In this way, host device 4 may be allowed to use a static logical data address for a certain set of data, while the physical data address at which the data is actually stored may change. Address translation module 32 may maintain the logical to physical data address translation table to map the logical data addresses to physical data addresses to allow use of the static logical data address by the host device 4 while the physical data address of the data may change, e.g., due to wear leveling, garbage collection, or the like. In some examples, the logical to physical data address translation table may be a single layer table, such that by applying a hash to a logical data address received from host device 4, address translation module 32 may directly retrieve a corresponding physical data address.

As discussed above, write module 34 of controller 8 may perform one or more operations to manage the writing of data to memory devices 16. For example, write module 34 may manage the writing of data to memory devices 16 by selecting one or more blocks within memory devices 16 to store the data and causing memory devices of memory devices 16 that include the selected blocks to actually store the data. As discussed above, write module 34 may cause address translation module 32 to update the logical to physical data address translation table based on the selected blocks. For instance, write module 34 may receive a message from host device 4 that includes a unit of data and a logical data address, select a block and page within a particular memory device of memory devices 16 to store the data, cause the particular memory device of memory devices 16 to actually store the data (e.g., via a channel controller of channel controllers 42 that corresponds to the particular memory device), and cause address translation module 32 to update the logical to physical data address translation table to indicate that the logical data address corresponds to the selected physical data address within the particular memory device of memory devices 16.

In some examples, in addition to causing the data to be stored by memory devices 16, write module 34 may cause memory devices 16 to store information which may be used to recover the unit of data should one or more of the blocks fail or become corrupted. The parity information may be used to recover the data stored by other blocks. In some examples, the parity information may be an XOR of the data stored by the other blocks.

In order to write a bit with a logical value of 0 (charged) to a bit with a previous logical value of 1 (uncharged), a large current is used. This current may be sufficiently large that it may cause inadvertent changes to the charge of adjacent flash memory cells. To protect against inadvertent changes, an entire block of flash memory cells may be erased to a logical value of 1 (uncharged) prior to writing any data to cells within the block. Because of this, flash memory cells may be erased at the block level and written at the page level.

Responsive to receiving a write command from host device 4, write module 34 may determine at which physical locations (e.g., blocks) of memory devices 16 to write the data. For example, write module 34 may request from address translation module 22 or maintenance module 36 one or more physical block addresses that are empty (e.g., store no data), partially empty (e.g., only some pages of the block store data), or store at least some invalid (or stale) data. Upon receiving the one or more physical block addresses, write module 34 may select one or more block as discussed above, and communicate a message that causes channel controllers 42 to write the data to the selected blocks.

Read module 38 similarly may control reading of data from memory devices 16. For example, read module 38 may receive a message from host device 4 requesting data with an associated logical data address. Address translation module 32 may convert the logical data address to a physical data address using the flash translation layer or table. Read module 38 then may control one or more of channel controllers 42 to retrieve the data from the physical data addresses. Similar to write module 34, read module 38 may select one or more blocks and communicate a message to that causes channel controllers 42 to read the data from the selected blocks.

Each channel controller of channel controllers 42 may be connected to a respective channel of channels 18. In some examples, controller 8 may include the same number of channel controllers 42 as the number of channels 18 of storage device 2. Channel controllers 42 may perform the intimate control of addressing, programming, erasing, and reading of memory devices 16 connected to respective channels, e.g., under control of write module 34, read module 38, and/or maintenance module 36.

Maintenance module 36 may be configured to perform operations related to maintaining performance and extending the useful life of storage device 6 (e.g., memory devices 16). For example, maintenance module 36 may implement at least one of wear leveling or garbage collection.

Scheduling module 40 of controller 8 may schedule operations to be performed by memory devices 16. For instance, scheduling module 40 may cause one or more of memory devices 16 to perform one or more operations based on requests received from other components of controller 8. In some examples, scheduling module 40 may cause a particular memory device of memory devices 16 to perform one or more operations by causing a channel controller corresponding to the particular memory device to output commands to the particular memory device. As one example, scheduling module 40 may permit channel controller 42A to output commands that cause memory device 16Aa to store data.

In accordance with one or more techniques of this disclosure, address translation module 32 may correlate physical page addresses associated with the same memory cells. For example, the memory cells may each store two bits and be referred to as MLC flash memory cells. A set of MLC flash memory cells may be associated with a first physical page address for the respective first bits of the respective MLC flash memory cells of the set of MLC flash memory cells. The first set of MLC flash memory cells may be associated with a second physical page address for the respective second bits of the respective MLC flash memory cells. Address translation module 32 may correlate the first physical page address with the second physical page address. In some examples, the first physical page address is associated with an upper page and the second physical page address is associated with a lower page.

Figure 4:
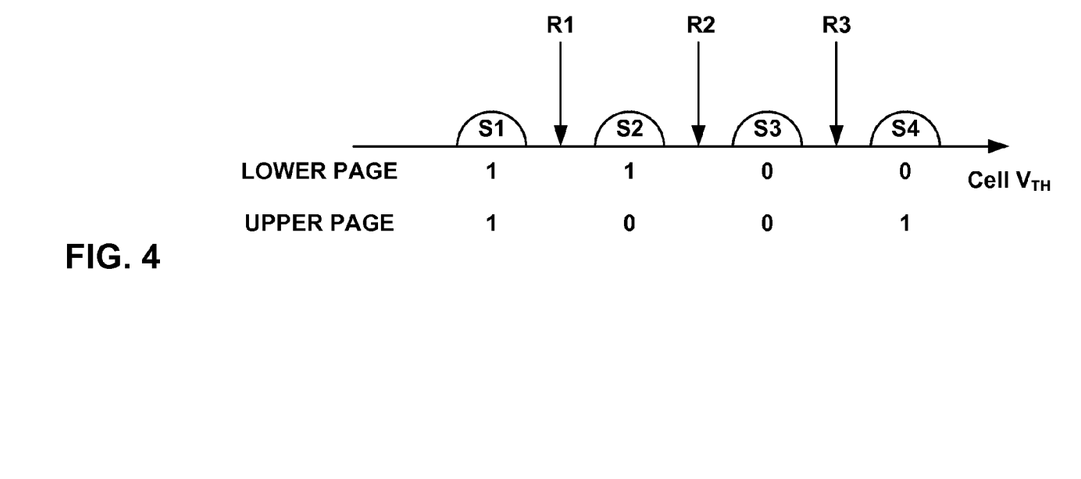
FIGS. 4 and 5 are conceptual diagrams illustrating cell threshold voltage distribution for 2 bits per cell (MLC) technology and corresponding bit values for a lower page and an upper page, in accordance with one or more techniques of this disclosure.

Controller 8 may receive a read command from host 4 via interface 14. The read command may identify a logical page address, and address translation module 32 may determine that the logical page address is associated with a physical page address associated with an upper page of a set of memory cells. Read module 38 may cause the value of the bit to be read from the upper page. For example, FIG. 4 is a conceptual diagram illustrating cell threshold voltage levels and corresponding bit values for a lower page and an upper page of an MLC flash memory cell. Read module 38 may cause one or more of channel controller 42 to read data from the upper page by causing first read reference voltage R1 and, separately, third read reference voltage R3 to be applied to the MLC flash memory cell. As shown in FIG. 4, the first read reference voltage R1 is between a first cell voltage state S1 that represents a 1 for the upper page and a second cell voltage state S2 that represents a 0 for the upper page. Similarly, the third read reference voltage R3 is between a third cell voltage state S3 that represents a 0 for the upper page and a fourth cell voltage state S4 that represents a 1 for the upper page.

Based on whether the voltage level of the MLC flash memory cell is first (lowest) cell voltage state S1, second (lower middle) cell voltage state S2, third (higher middle) cell voltage state S3, or fourth (highest) cell voltage state S4, MLC flash memory cell may or may not be electrically conductive when first read reference voltage R1 is applied and when third read reference voltage R3 is applied. In this way, read module 38 may determine whether the first bit stored by the MLC flash memory cell and associated with the upper page is a 0 or a 1. In some examples, controller 8 (e.g., read module 38) may cause the value of the first bit stored by the MLC flash memory cell and associated with the upper page to be stored by volatile memory 12.

Controller 8 also may receive a request from host 4 to read data associated with a logical page address that address translation module 32 determines is associated with the physical page address associated with lower page of the MLC flash memory cell. Read module 38 may cause one or more of channel controller 42 to apply a second read reference voltage R2 the MLC flash memory cell. As shown in FIG. 4, the second read reference voltage R2 is between the second cell voltage state S2 that represents a 1 for the lower page and a third cell voltage state S3 that represents a 0 for the lower page. In this way, read module 38 may determine a value of a second bit associated with the second physical page address associated with the lower page.

To determine the soft decision value associated with the second bit associated with the lower page, read module 38 may utilize the value of the second bit associated with the lower page determined by applying the second read reference voltage R2 and the value of the first bit associated with the upper page. In some examples, the soft decision value may include a LLR. For example, read module 38 may assign a relatively large positive value (e.g., 100) to the soft decision value associated with the second bit in instances in which read module 38 determines that the first bit has a value of 1 and second bit has a value of 0 (which indicates a high probability that the second bit has a value of 0), whereas read module 38 may assign a relatively small positive value (e.g., 10) to the soft decision value associated with the second bit in instances in which read module 38 determines that the first bit has a value of 0 and second bit has a value of 0 (which indicates a low probability that the second bit has a value of 0). As another example, read module 38 may assign a relatively large negative value (e.g., −100) to the soft decision value associated with the second bit (e.g., LLR) in instances in which read module 38 determines that the first bit has a value of 1 and second bit has a value of 1 (which indicates a high probability that the second bit has a value of 1), whereas read module 38 may assign a relatively small negative value (e.g. −10) to the soft decision value associated with the second bit in instances in which read module 38 determines that the first bit has a value of 0 and second bit has a value of 1 (which indicates a low probability that the second bit has a value of 1). In some examples, read module 38 may not determine the soft decision value at the time of reading the value of the first bit, and may instead determine the soft decision value associated with the second after reading the second bit.

In some examples, read module 38 may determine a value for the second bit based on the information obtained by applying the second read reference voltage R2 to the memory cell, and may utilize the soft decision value in an error correction code (ECC) algorithm to verify the value assigned to the second bit. For example, read module 38 may utilize the soft decision value in a low density parity check (LDPC) algorithm to verify the value assigned to the second bit. For example, a relatively large absolute value of the soft decision value may indicate a relatively higher likelihood that the value of the second bit is the value read using second read reference voltage R2. Conversely, a relatively low value of the soft decision value may indicate a relatively lower likelihood that the value of the second bit is the value read using second read reference voltage R2.

As an example, read module 38 may determine the value of the first bit is 1 after causing first read reference voltage R1 and third read reference voltage R3 to be applied to the memory cell. Based on the value of the first bit being 1, read module 38 may assign a relatively large absolute value (e.g., −100 or 100) to the soft decision value of the second bit. As another example, in instances in which read module 38 determines the value of the first bit is 0, read module 38 may assign a relatively small absolute value (e.g. −10 or 10) to the soft decision value associated with the second bit. Continuing the example, read module 38 may cause the second read reference voltage R2 to be applied to the memory cell and may determine the sign of the soft decision value associated with the second bit based on the value of the second bit. The soft decision values of the second bit may be utilized in an ECC algorithm to decode the lower page data.

Because the first and second physical page addresses are correlated and the value of the first bit may be stored in volatile memory 12 (e.g., a read cache) in instances in which read module 38 has read data from the upper page before reading data from the lower page, read module 38 may not cause the upper page to be read again to determine the soft decision value associated with the second bit. Instead, read module 38 may retrieve the value of the first bit from volatile memory 12 and utilize the value to determine the soft decision value. This may reduce a number of read operations used to determine the value of the second bit, which may increase read throughput, reduce wear to memory devices 16, or both.

In some examples, utilizing the soft decision value to determine the value of the second bit associated with the lower page may allow modification of the cell voltage states to facilitate determining the first bit value associated with the upper page. For example, FIG. 5 is a conceptual diagram illustrating cell threshold voltage levels and corresponding bit values for a lower page, a middle page, and an upper page of an MLC flash memory cell.

Figure 5:
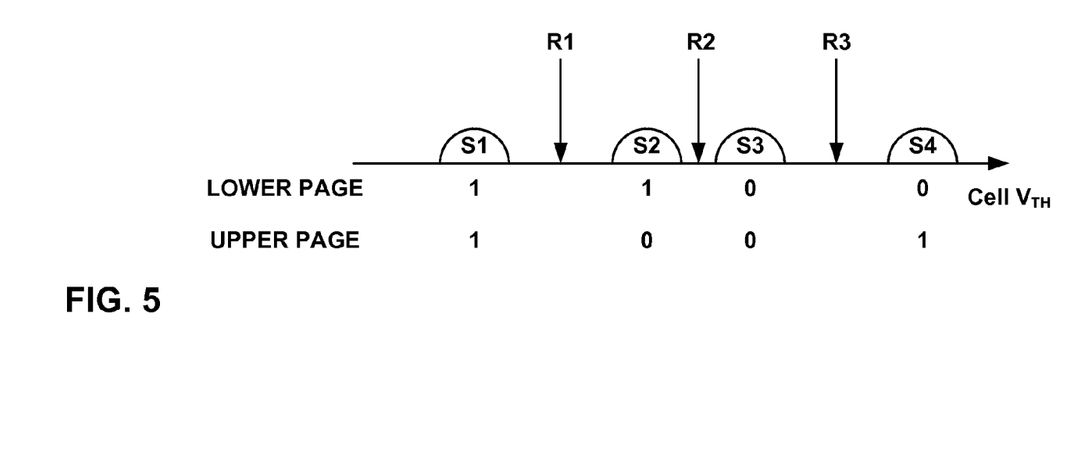

As shown in FIG. 5 voltage differences or spacings at the upper page decision boundaries (between first cell voltage state S1 and second cell voltage state S2, and between third cell voltage state S3 and fourth cell voltage state S4) are larger than voltage difference or spacing at the lower page decision boundary (between second cell voltage state S2 and third cell voltage state S3). As described above, read module 38 may determine the value of the first bit associated with the upper page (and the first physical page address) using read reference voltages R1 and R3 and may not utilize a soft decision value to determine the value of the first bit. Because of this, the greater voltage differences at the upper page decision boundaries may facilitate discrimination between the first cell voltage state S1 (representing a 1 for the upper page) and the second cell voltage state S2 (representing a 0 for the upper page) or between the third cell voltage state S3 (representing a 0 for the upper page) and the fourth cell voltage state S4 (representing a 1 for the upper page).

This greater discrimination between first cell voltage state S1 and the second cell voltage state S2, and between the third cell voltage state S3 and the fourth cell voltage state S4 additionally may allow reducing in a number of read reference voltages applied to the MLC memory cell to determine the value of the bit associated with the upper page. For example, in some instances, only a single read reference voltage with a voltage level between S1 and S2, read reference voltage R1, may be applied, rather than multiple read reference voltages with voltage levels between S1 and S2. Similarly, in some instances, only a single read reference voltage with a voltage level between S3 and S4, read reference voltage R3, may be applied, rather than multiple read reference voltages with voltage levels between S3 and S4. In some examples, this may reduce a number of read reference voltages used to determine the value of the first bit associated with the upper page. For example, instead of using six read reference voltages (three each around R1 and R3), as is done in some devices, only two read reference voltages (R1 and R3) may be used to determine the value of the first bit associated with the upper page.

Further, because read module 38 utilizes the soft decision value in determining the value of the second bit associated with the lower page (and the second physical page address), the voltage difference or spacing at the lower page decision boundary (between second cell voltage state S2 and third cell voltage state S3) may be smaller, and the soft decision value may contribute to the ability of read module 38 to accurately determine the value of the second bit. Moreover, utilizing the soft decision value of the second bit associated with the lower page based on the value of the first bit and the value of the second bit may allow reading the value of the lower page using only a single read reference voltage (second read reference voltage R2), rather than using multiple, different read reference voltages near second read reference voltage R2. For example, instead of using three read reference voltages around R2, as is done in some devices, only a single read reference voltage R2 may be used to read the value of the second bit associated with the lower page. Additionally, because the logical addresses of the upper and lower pages are associated, reading of the upper page may not need to be repeated to determine the soft decision value associated the second bit. In a best-case scenario, this may reduce a number of read cycles used to determine the values of the first and second bits from nine (six read cycles to determine the value of the first bit and three read cycles to determine the value of the second bit) to three read cycles (two to determine the value of the first bit, and one read cycle to determine the value of the second bit). In this way, the soft decision value may facilitate accurate determination of both the first bit (associated with the upper page) and the second bit (associated with the lower page) with fewer read operations, even though the soft decision value is only directly used by read module 38 to determine the value of the second bit.

Figure 6:
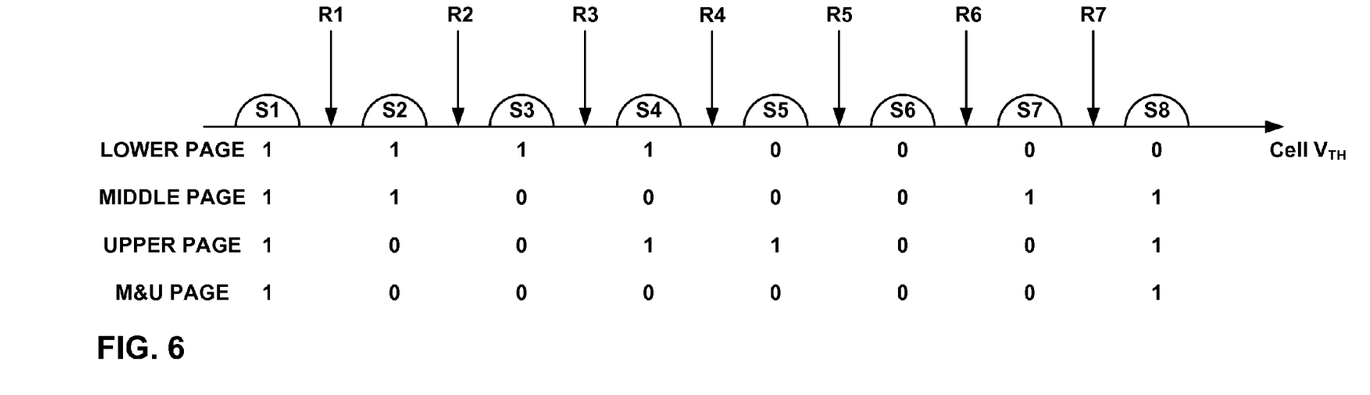
FIGS. 6 and 7 are conceptual diagrams illustrating cell threshold voltage distribution for 3 bits per cell (TLC) technology and corresponding bit values for a lower page, a middle page, and an upper page, in accordance with one or more techniques of this disclosure.

The concepts described with respect to the two-bits-per-cell memory cell in FIGS. 4 and 5 may be applied to memory cells that store three-bits-per-cell. FIG. 6 is a conceptual diagram illustrating cell threshold voltage levels and corresponding bit values for a lower page, a middle page, and an upper page of a TLC flash memory cell.

Controller 8 may receive a read command from host 4 via interface 14. The read command may identify a logical page address, and address translation module 32 may determine that the logical page address is associated with a physical page address associated with an upper page of a set of memory cells. Read module 38 may cause the value of the bit to be read from the upper page. Read module 38 may cause one or more of channel controllers 42 to read data from the upper page by separately causing first read reference voltage R1, third read reference voltage R3, fifth read reference voltage R5, and seventh read reference voltage R7 to be applied to the TLC flash memory cell. As shown in FIG. 6, the first read reference voltage R1 is between a first cell voltage state S1 that represents a 1 for the upper page and a second cell voltage state S2 that represents a 0 for the upper page. Similarly, the third read reference voltage R3 is between a third cell voltage state S3 that represents a 0 for the upper page and a fourth cell voltage state S4 that represents a 1 for the upper page; the fifth read reference voltage R5 is between a fifth cell voltage state S5 that represents a 1 for the upper page and a sixth cell voltage state S6 that represents a 0 for the upper page; and the seventh read reference voltage R7 is between a seventh cell voltage state S7 that represents a 0 for the upper page and an eights cell voltage state S8 that represents a 1 for the upper page.

Based on whether the voltage level of the TLC flash memory cell is first cell voltage state S1, second cell voltage state S2, third cell voltage state S3, fourth cell voltage state S4, fifth cell voltage state S5, sixth cell voltage state S6, seventh cell voltage state S7, or eighth cell voltage state S8, TLC flash memory cell may or may not be electrically conductive when first read reference voltage R1 is applied, when third read reference voltage R3 is applied, when fifth read reference voltage R5 is applied, or when seventh read reference voltage R7 is applied. In this way, read module 38 may determine whether the first bit stored by the TLC flash memory cell and associated with the upper page is a 0 or a 1. In some examples, controller 8 (e.g., read module 38) may cause the value of the first bit stored by the TLC flash memory cell and associated with the upper page to be stored by volatile memory 12.

Controller 8 also may receive a request from host 4 to read data associated with a logical page address that address translation module 32 determines is associated with the physical page address associated with a middle page of the TLC flash memory cell. Read module 38 may cause one or more of channel controller 42 to separately apply a second read reference voltage R2 and a sixth read reference voltage R6 to the TLC flash memory cell. As shown in FIG. 6, the second read reference voltage R2 is between the second cell voltage state S2 that represents a 1 for the middle page and a third cell voltage state S3 that represents a 0 for the middle page, and the sixth read reference voltage R6 is between the sixth cell voltage state S6 that represents a 0 for the middle page and a seventh cell voltage state S7 that represents a 1 for the middle page. In this way, read module 38 may determine a value of a second bit associated with the second physical page address associated with the middle page.

To verify the value of the second bit associated with the middle page, read module 38 may utilize a soft decision value based at least in part on the value of the second bit associated with the middle page determined by applying the second read reference voltage R2 and the sixth reference voltage R6, and the value of the first bit associated with the upper page. In some examples, the soft decision value may include a LLR. For example, read module 38 may assign a relatively large absolute value (e.g., −100 for the second bit 1, 100 for the second bit 0) to the soft decision value associated with the second bit in instances in which read module 38 determines that the first bit has a value of 1. As another example, read module 38 may assign a relatively small absolute value (e.g., −10 for the second bit 1, 10 for the second bit 0) to the soft decision value associated with the second bit in instances in which read module 38 determines that the first bit has a value of 0.

For example, a relatively high absolute value of the soft decision value may indicate a relatively higher likelihood that the value of the second bit is a correct value. Conversely, a relatively low absolute value of the soft decision value may indicate a relatively lower likelihood that the value of the second bit is a correct value.

In some examples, read module 38 may determine a value for the second bit based on the information obtained by applying the second read reference voltage R2 and the sixth read reference voltage R6 to the TLC memory cell, and may utilize the soft decision value in an ECC algorithm to verify the value assigned to the second bit. For example, read module 38 may utilize the soft decision value in a LDPC algorithm to verify the value assigned to the second bit. In some examples, controller 8 (e.g., read module 38) may cause the value of the first bit stored by the TLC flash memory cell and associated with the upper page to be stored by volatile memory 12.

Controller 8 also may receive a request from host 4 to read data associated with a logical page address that address translation module 32 determines is associated with the third physical page address associated with a lower page of the TLC flash memory cell. Read module 38 may cause one or more of channel controller 42 to apply a fourth read reference voltage R4 to the TLC flash memory cell. As shown in FIG. 6, the fourth read reference voltage R4 is between the fourth cell voltage state S4 that represents a 1 for the lower page and a fifth cell voltage state S5 that represents a 0 for the lower page. In this way, read module 38 may determine a value of a third bit associated with the third physical page address associated with the lower page.

To verify the value of the third bit associated with the lower page, read module 38 may utilize a soft decision value based on the value of the third bit associated with the lower page determined by applying the fourth read reference voltage R4, the value of the first bit associated with the upper page, and the value of the second bit associated with the middle page. In some examples, the soft decision value may include a LLR. For example, read module 38 may assign a relatively large absolute value (e.g., −100, 100) to the soft decision value in instances in which read module 38 determines that the first bit and the second bit both have a value of 1. As another example, read module 38 may assign a relatively small absolute value (e.g., −10, 10) to the soft decision value in instances in which read module 38 determines that the second bit has a value of 0. As another example, read module 38 may assign a medium absolute value (e.g., −40, 40) to the soft decision value in instances in which read module 38 determines that the second bit has a value of 1 and the first bit has a value of 0. Read module 38 may utilize the value of the third bit associated with the lower page determined by applying the fourth read reference voltage R4 to assign a sign (e.g., + or −) to the soft decision value. For example, if the value of the third bit associated with the lower page determined by applying the fourth read reference voltage R4 is 1, the sign may be negative, and if the value of the third bit associated with the lower page determined by applying the fourth read reference voltage R4 is 0, the sign may be positive.

In some examples, read module 38 may further utilize soft decision value based on a bit-wise-and operator between the middle page and the upper page. In some examples, read module 38 may not determine the soft decision value at the time of reading the value of the first bit or at the time of reading the second bit, and may instead determine the soft decision value after determining regarding the value of the third bit.

In some examples, read module 38 may determine a value for the third bit based on the information obtained by applying the fourth read reference voltage R4 to the TLC memory cell, and may utilize the soft decision value in an ECC algorithm to verify the value assigned to the third bit. For example, read module 38 may utilize the soft decision value in a LDPC algorithm to verify the value assigned to the third bit.

In some examples, utilizing the soft decision value to determine the value of the second bit associated with the middle page and the value of the first bit associated with the lower page may allow modification of the cell voltage states to facilitate determining the first bit value associated with the upper page. For example, FIG. 7 is a conceptual diagram illustrating cell threshold voltage levels and corresponding bit values for a lower page, a middle page, and an upper page of a TLC flash memory cell.

Figure 7:
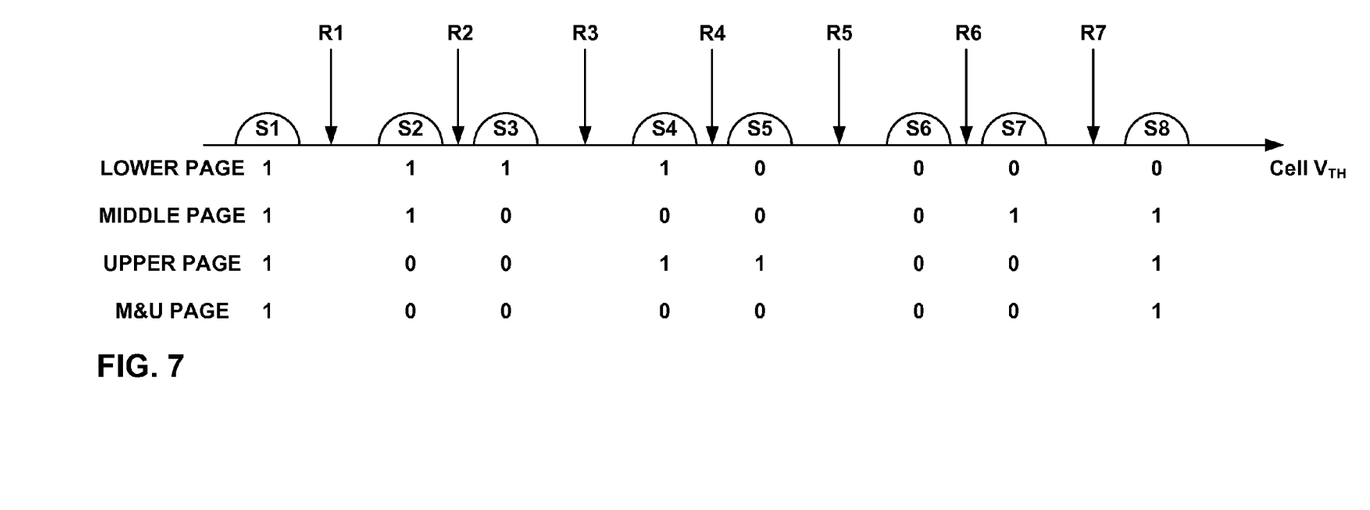

As shown in FIG. 7 voltage differences or spacings at the upper page decision boundaries (between first cell voltage state S1 and second cell voltage state S2, between third cell voltage state S3 and fourth cell voltage state S4, between fifth cell voltage state S5 and sixth cell voltage state S6, and between seventh cell voltage state S7 and eighth cell voltage state S8) are larger than the voltage differences or spacings at the middle page decision boundaries (between second cell voltage state S2 and third cell voltage state S3, and between sixth cell voltage state S6 and seventh cell voltage state S7) and are larger than the voltage difference or spacing at the lower page decision boundary (between fourth cell voltage state S4 and fifth voltage state S5). As described above, read module 38 may determine the value of the first bit associated with the upper page (and the first physical page address) using read reference voltages R1, R3, R5, and R7, and may not utilize a soft decision value to determine the value of the first bit. Because of this, the greater voltage differences at the upper page decision boundaries may facilitate discrimination between the first cell voltage state S1 (representing a 1 for the upper page) and the second cell voltage state S2 (representing a 0 for the upper page), or between the third cell voltage state S3 (representing a 0 for the upper page) and the fourth cell voltage state S4 (representing a 1 for the upper page), or between the fifth cell voltage state S5 (representing a 1 for the upper page) and the sixth cell voltage state S6 (representing a 0 for the upper page), or between the seventh cell voltage state S7 (representing a 0 for the upper page) and the eighth cell voltage state S8 (representing a 1 for the upper page).

This greater discrimination between first cell voltage state S1 and the second cell voltage state S2, between the third cell voltage state S3 and the fourth cell voltage state S4, between the fifth cell voltage state S5 and the sixth cell voltage state S6, and between the seventh cell voltage state S7 and the eighth cell voltage state S8 additionally may allow reducing in a number of read reference voltages applied to the TLC memory cell to determine the value of the bit associated with the upper page. For example, in some instances, only a single read reference voltage with a voltage level between S1 and S2, read reference voltage R1, may be applied, rather than multiple read reference voltages with voltage levels between S1 and S2. Similarly, in some instances, only a single read reference voltage with a voltage level between S3 and S4, read reference voltage R3, may be applied, rather than multiple read reference voltages with voltage levels between S3 and S4; only a single read reference voltage with a voltage level between S5 and S6, read reference voltage R5, may be applied, rather than multiple read reference voltages with voltage levels between S5 and S6; and only a single read reference voltage with a voltage level between S7 and S8, read reference voltage R7, may be applied, rather than multiple read reference voltages with voltage levels between S7 and S8. In some examples, this may reduce a number of read reference voltages used to determine the value of the first bit associated with the upper page. For example, instead of using twelve read reference voltages (three each around R1, R3, R5, and R7), as is done in some devices, only four read reference voltages (R1, R3, R5, and R7) may be used to determine the value of the first bit associated with the upper page.

Further, because read module 38 utilizes the soft decision value in determining the value of the second bit associated with the middle page and the third bit associated with the lower page, the voltage differences or spacings at the middle page decision boundaries and the lower page decision boundary may be smaller, and the soft decision value may contribute to the ability of read module 38 to accurately determine the value of the second bit and the value of the third bit. Moreover, utilizing the soft decision value of the second bit associated with the middle page based on the value of the first bit and the value of the second bit may allow reading the value of the middle page using only two read reference voltages (second read reference voltage R2 and sixth read reference voltage R6), rather than using multiple, different read reference voltages near second read reference voltage R2 and multiple, different read reference voltages near sixth read reference voltage R6. For example, instead of using three read reference voltages around R2, as is done in some devices, only a single read reference voltage R2 may be used. Similarly, instead of using three read reference voltages around R6, as is done in some devices, only a single read reference voltage R6 may be used.

Additionally, utilizing the soft decision value of the third bit associated with the lower page based on the value of the first bit, the value of the second bit, and the value of the third bit may allow reading the value of the lower page using only a single read reference voltage (fourth read reference voltage R4), rather than using multiple, different read reference voltages near fourth read reference voltage R4. For example, instead of using three read reference voltages around R4, as is done in some devices, only a single read reference voltage R4 may be used to read the value of the third bit associated with the lower page. Because the logical addresses of the upper, middle, and lower pages are associated, reading of the upper page may not need to be repeated to determine the soft decision value associated with the second bit, and reading of the upper and middle pages may not need to be repeated to determine the soft decision value associated with the third bit. This may reduce a number of read cycles used to determine the values of the first and second bits from 21 (12 read cycles to determine the value of the first bit, 6 read cycles to determine the value of the second bit, and 3 read cycles to determine the value of the third bit) to 7 read cycles (4 read cycles to determine the value of the first bit, 2 read cycles to determine the value of the second bit, and 1 read cycle to determine the value of the third bit). In this way, the soft decision value may facilitate accurate determination of the first bit (associated with the upper page), the second bit (associated with the middle page), and the third bit (associated with the lower page) even though the soft decision value is not directly used by read module 38 to determine the value of the first bit.

Figure 8:
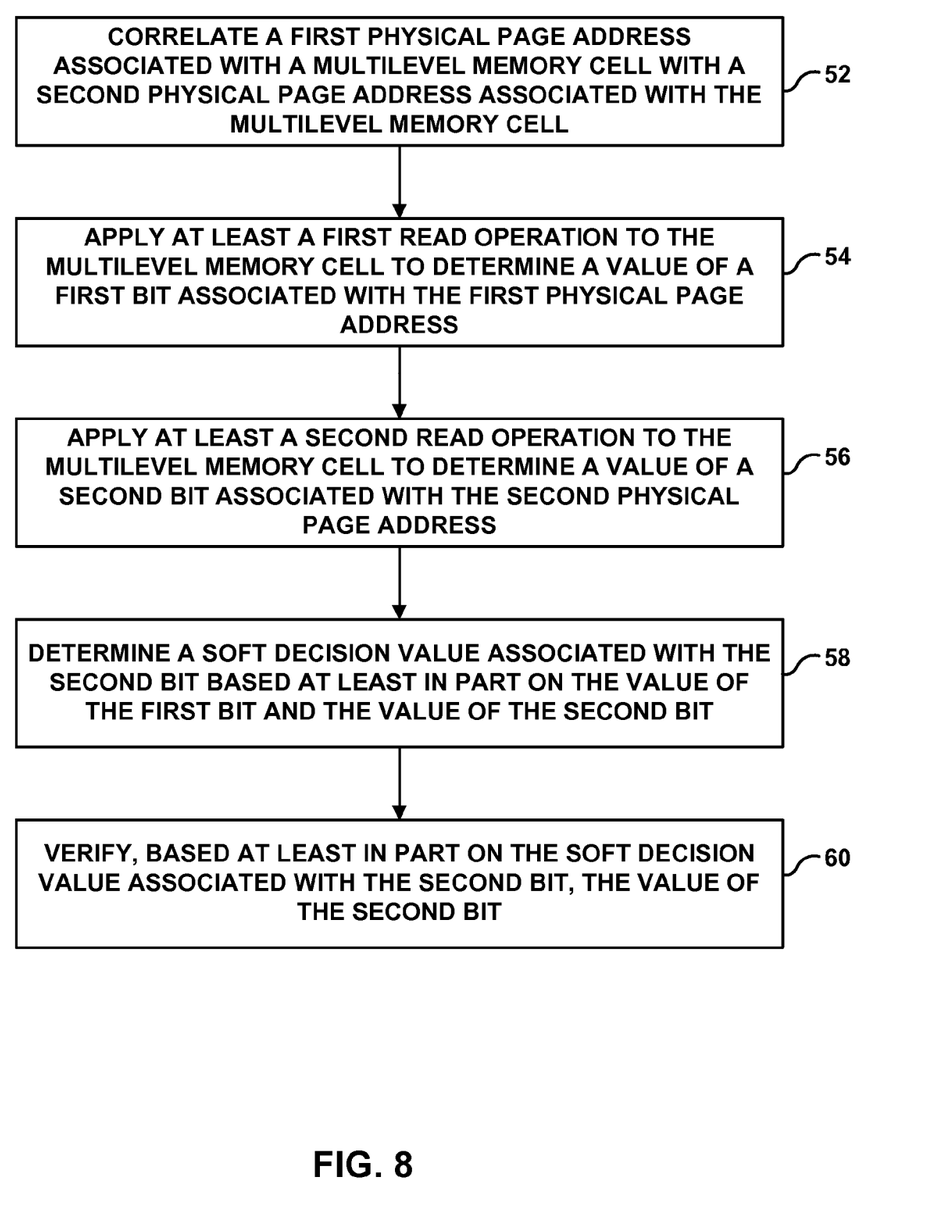
FIG. 8 is a flow diagram illustrating an example technique for correlating a first physical page address associated with a multilevel memory cell and a second physical page address associated with the multilevel memory cell and verifying a value of a second bit associated with the second physical page address based at least in part on a value of a first bit associated with the first physical page address and the value of the second bit, in accordance with one or more techniques of this disclosure.

FIG. 8 is a flow diagram illustrating an example technique for correlating, by at least one processor, a first physical page address associated with a multilevel memory cell and a second physical page address associated with the multilevel memory cell and determining, by the at least one processor, a value a second bit associated with the second physical page address based at least in part on a value of a first bit associated with the first physical page address, in accordance with one or more techniques of this disclosure. The technique of FIG. 8 will be described with respect to storage environment 2 of FIG. 1 and controller 8 of FIGS. 1 and 3 for purposes of illustration. However, it will be understood that the technique of FIG. 8 may be performed by a different processor or in a different storage environment, and that controller 8 and storage environment 2 may perform other techniques for reading data from storage devices 16.

The technique of FIG. 8 includes correlating, by at least one processor (e.g., controller 8), a first physical page address associated with a multilevel memory cell and a second physical page address associated with the multilevel memory cell (52). As described above, in some examples, the first physical page address is associated with an upper page of the multilevel memory cell and the second physical page address is associated with a lower page of the multilevel memory cell. In some examples, address translation module 32 may correlate the first physical page address associated with a multilevel memory cell and the second physical page address associated with the multilevel memory cell (52).

The technique of FIG. 8 also includes causing, by the at least one processor (e.g., controller 8), at least a first read operation to be applied the multilevel memory cell to determine a value of a first bit associated with the first physical page address (54). Depending on the number of bits-per-cell, the at least a first read operation may include, for example, causing first and second read reference voltages to be applied to a MLC memory cell, or first, second, third, and fourth read reference voltages to be applied to a TLC memory cell. In some examples, read module 38 may control one of channel controllers 42 to cause the at least a first read operation to be applied the multilevel memory cell to determine a value of a first bit associated with the first physical page address (54).

The technique of FIG. 8 also includes causing, by the at least one processor (e.g., controller 8), at least a second read operation to be applied the multilevel memory cell to determine a value of a second bit associated with the second physical page address (58). Depending on the number of bits-per-cell, the at least a second read operation may include, for example, causing a third, different read reference voltage to be applied to a MLC memory cell), or causing fifth and sixth read reference voltages to be applied to a TLC memory cell. In some examples, read module 38 may control one of channel controllers 42 to cause the at least a second read operation to be applied the multilevel memory cell to determine a value of a second bit associated with the second physical page address (58).

The technique of FIG. 8 further includes determining, by the at least one processor (e.g., controller 8), a soft decision value associated with the second bit based at least in part on the value of the first bit and the value of the second bit (56). For example, read module 38 of controller 8 may assign a relatively large absolute value (e.g., −100, 100) to the soft decision value (e.g., LLR) associated with the second bit in instances in which controller 8 determines that the first bit has a value of 1. As another example, read module 38 may assign a relatively small absolute value (e.g., −10, 10) to the soft decision value associated with the second bit (e.g., LLR) in instances in which read module 38 determines that the first bit has a value of 0. In some examples, read module 38 may not determine the soft decision value information of the second bit at the time of reading the value of the first bit.

The technique of FIG. 8 additionally includes verifying, by the at least one processor (e.g., controller 8), based at least in part on the soft decision value information associated with the second bit, the value of the second bit (60). For example, read module 38 may utilize the soft decision value information in an ECC algorithm to verify the value assigned to the second bit. For example, read module 38 may utilize the soft decision value information in a LDPC algorithm to verify the value assigned to the second bit.

Although the foregoing examples have been described with respect to a controller of a storage device, in other examples, the examples described herein may be implemented by another processor, such as a general purpose processor, or a read channel. Further, although the examples have been described with respect to flash memory, the techniques described herein may be utilized with other types of multi-level memory cells. For example, the techniques described herein may be utilized with resistive RAM, phase-change memory, magnetoresistive RAM, DRAM, or the like.

The techniques described in this disclosure may be implemented, at least in part, in hardware, software, firmware, or any combination thereof. For example, various aspects of the described techniques may be implemented within one or more processors, including one or more microprocessors, DSPs, ASICs, FPGAs, or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. A control unit including hardware may also perform one or more of the techniques of this disclosure.

Such hardware, software, and firmware may be implemented within the same device or within separate devices to support the various techniques described in this disclosure. In addition, any of the described units, modules or components may be implemented together or separately as discrete but interoperable logic devices. Depiction of different features as modules or units is intended to highlight different functional aspects and does not necessarily imply that such modules or units must be realized by separate hardware, firmware, or software components. Rather, functionality associated with one or more modules or units may be performed by separate hardware, firmware, or software components, or integrated within common or separate hardware, firmware, or software components.

The techniques described in this disclosure may also be embodied or encoded in an article of manufacture including a computer-readable storage medium encoded with instructions. Instructions embedded or encoded in an article of manufacture including a computer-readable storage medium encoded, may cause one or more programmable processors, or other processors, to implement one or more of the techniques described herein, such as when instructions included or encoded in the computer-readable storage medium are executed by the one or more processors. Computer readable storage media may include random access memory (RAM), read only memory (ROM), programmable read only memory (PROM), erasable programmable read only memory (EPROM), electronically erasable programmable read only memory (EEPROM), flash memory, a hard disk, a compact disc ROM (CD-ROM), a floppy disk, a cassette, magnetic media, optical media, or other computer readable media. In some examples, an article of manufacture may include one or more computer-readable storage media.

In some examples, a computer-readable storage medium may include a non-transitory medium. The term "non-transitory" may indicate that the storage medium is not embodied in a carrier wave or a propagated signal. In certain examples, a non-transitory storage medium may store data that can, over time, change (e.g., in RAM or cache).

Various examples have been described. These and other examples are within the scope of the following claims.

What is claimed is:

1. A method comprising:
    correlating, by at least one processor, a first physical page address associated with a multilevel memory cell and a second physical page address associated with the multilevel memory cell;
    causing, by the at least one processor, at least a first read operation to be applied the multilevel memory cell to determine a value of a first bit associated with the first physical page address;
    causing, by the at least one processor, at least a second read operation to be applied the multilevel memory cell to determine a value of a second bit associated with the second physical page address;
    determining, by the at least one processor, a soft decision value associated with the second bit based on the value of the first bit and the value of the second bit; and
    verifying, by the at least one processor, based at least in part on the soft decision value information associated with the second bit, the value of the second bit.

2. The method of claim 1, wherein the first physical page address comprises a physical page address associated with an upper page of the multilevel memory cell, and wherein the second physical page address comprises a physical page address associated with a lower page of the multilevel memory cell.

3. The method of claim 1, wherein:
    the multilevel memory cell comprises a two-bit-per-cell memory cell;
    causing at least the first read operation to be applied the multilevel memory cell comprises causing two read reference voltages to be applied to the two-bit-per-cell memory cell to determine the value of the first bit;
    causing at least the second read operation to be applied to the multilevel memory cell comprises applying one read reference voltage to the two-bit-per-cell memory cell; and
    verifying the value of the second bit comprises determining, by the processor, a log-likelihood-ratio and utilizing the log-likelihood-ratio in an error correction code utilized to verify the second bit.

4. The method of claim 3, wherein the log-likelihood-ratio comprises a large absolute value when the first bit is equal to 1 and a small absolute value when the first bit is equal to 0.

5. The method of claim 4, wherein:
    a first cell voltage state has a voltage lower than the first read reference voltage, the second read reference voltage, and the third read reference voltage;
    a second cell voltage state has a voltage greater than the first read reference voltage and less than the second read reference voltage and the third read reference voltage;
    a third cell voltage state has a voltage greater than the second read reference voltage and less than the third read reference voltage;
    a voltage difference between the first cell voltage state and the second cell voltage state is greater than a voltage difference between the second cell voltage state and the third voltage state.

6. The method of claim 1, wherein correlating the first physical page address associated with the multilevel memory cell and the second physical page address associated with the multilevel memory cell comprises associating, by the processor, data read from the first physical page address and data read from the second physical page address in a read cache.

7. A storage device comprising:
    at least one memory device comprising at least one multilevel memory cell;
    at least one processor configured to:
        correlate a first physical page address associated with the multilevel memory cell and a second physical page address associated with the multilevel memory cell;
        cause at least a first read operation to be applied to the multilevel memory cell to determine a value of a first bit associated with the first physical page address;
        cause at least a second read operation to be applied to the multilevel memory cell to determine a value of a second bit associated with the second physical page address; determine a soft decision value associated with the second bit based at least in part on the value of the first bit and the value of the second bit; and
        verify, based at least in part on the soft decision value associated with the second bit, the value of the second bit.

8. The storage device of claim 7, wherein the first physical page address comprises a physical page address associated with an upper page of the multilevel memory cell, and wherein the second physical page address comprises a physical page address associated with a lower page of the multilevel memory cell.

9. The storage device of claim 7, wherein:
    the multilevel memory cell comprises a two-bit-per-cell memory cell;
    the at least one processor is configured to cause a first read reference voltage to be applied to the two-bit-per-cell memory cell and cause a second, different read reference voltage to be applied to the two-bit-per-cell memory cell to determine the value of the first bit associated with the first physical page address;
    the at least one processor is configured to cause a third, different read reference voltage to be applied to the two-bit-per-cell memory cell to determine the value of the second bit;
    the third, different read reference voltage has a magnitude between the first read reference voltage and the second, different read reference voltage; and
    the at least one processor is configured to verify the value of the second bit by at least determining a log-likelihood-ratio and utilizing the log-likelihood-ratio in an error correction code utilized to verify the second bit.

10. The storage device of claim 9, wherein the log-likelihood-ratio comprises a large absolute value when the first bit is equal to 1 and a small absolute value when the first bit is equal to 0.

11. The storage device of claim 10, wherein:
    a first cell voltage state has a voltage lower than the first read reference voltage, the second read reference voltage, and the third read reference voltage;
    a second cell voltage state has a voltage greater than the first read reference voltage and less than the second read reference voltage and the third read reference voltage;
    a third cell voltage state has a voltage greater than the second read reference voltage and less than the third read reference voltage;
    a voltage difference between the first cell voltage state and the second cell voltage state is greater than a voltage difference between the second cell voltage state and the third voltage state.

12. The storage device of claim 7, wherein the at least one processor is configured to correlate the first physical page address associated and the multilevel memory cell and the second physical page address associated with the multilevel memory cell by at least associating data read from the first physical page address and data read from the second physical page address in a read cache.

13. The storage device of claim 7, wherein the at least one processor comprises at least one of a controller of the storage device or a read channel of the storage device.

14. A storage device comprising:
   at least one memory device comprising at least one multilevel memory cell;
   means for correlating a first physical page address associated with the multilevel memory cell and a second physical page address associated with the multilevel memory cell;
   means for applying at least a first read operation to the multilevel memory cell to determine a value of a first bit associated with the first physical page address;
   means for applying at least a second read operation to the multilevel memory cell to determine a value of a second bit associated with the second physical page address;
   means for determining a soft decision value based at least in part on the value of the first bit and the value of the second bit; and
   means for verifying, based at least in part on the soft decision value, the value of the second bit.

* * * * *